(12) United States Patent
Jung

(10) Patent No.: US 8,242,835 B2  
(45) Date of Patent: Aug. 14, 2012

(54) SEMICONDUCTOR INTEGRATED CIRCUIT

(75) Inventor: Ho-Don Jung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 105 days.

(21) Appl. No.: 12/832,210

(22) Filed: Jul. 8, 2010

(65) Prior Publication Data

US 2011/0241768 A1  Oct. 6, 2011

(30) Foreign Application Priority Data

Mar. 31, 2010  (KR) .................. 10-2010-0029580

(51) Int. Cl.
*G05F 1/10*  (2006.01)

(52) U.S. Cl. ........................ 327/540; 327/538

(58) Field of Classification Search .................. 327/540
See application file for complete search history.

(56) References Cited

U.S. PATENT DOCUMENTS

| | | | | |
|---|---|---|---|---|
| 6,249,177 B1 * | 6/2001 | Savage et al. | ................. | 327/546 |
| 6,407,538 B1 * | 6/2002 | Kinoshita et al. | ............. | 323/314 |
| 6,753,721 B2 * | 6/2004 | Otsuka et al. | ................. | 327/540 |
| 6,927,557 B2 * | 8/2005 | Proll et al. | .................... | 323/312 |
| 6,949,971 B2 * | 9/2005 | Jang | ................................ | 327/541 |
| 7,053,696 B2 * | 5/2006 | Shiratake et al. | ............. | 327/543 |
| 7,646,234 B2 * | 1/2010 | Dubey | .......................... | 327/538 |
| 7,768,863 B1 * | 8/2010 | Dewey | ........................... | 365/226 |
| 7,808,856 B2 * | 10/2010 | Ehrenreich et al. | ........... | 365/229 |
| 7,884,594 B2 * | 2/2011 | Rasmus | ........................ | 323/312 |
| 2005/0093581 A1 * | 5/2005 | Kang | ................................ | 327/73 |
| 2007/0285142 A1 * | 12/2007 | Shin et al. | ..................... | 327/208 |
| 2008/0238384 A1 * | 10/2008 | Fujikura et al. | ................ | 323/272 |
| 2011/0141098 A1 * | 6/2011 | Yaguma et al. | ................ | 345/212 |

FOREIGN PATENT DOCUMENTS

KR  1020070030474  3/2007

OTHER PUBLICATIONS

Notice of Allowance issued from Korean Intellectual Property Office on Apr. 4, 2011.

* cited by examiner

*Primary Examiner* — Thomas J Hiltunen  
(74) *Attorney, Agent, or Firm* — IP & T Group LLP (57) ABSTRACT

A semiconductor integrated circuit includes a first ground voltage pad, a second ground voltage pad, an internal voltage generation unit, and a division unit. The first ground voltage pad is configured to receive a first ground voltage. The second ground voltage pad is configured to receive a second ground voltage. The internal voltage generation unit includes a comparison unit configured to compare a reference voltage with a feedback voltage by using the first ground voltage, and a driving unit configured to drive an internal voltage terminal in response to an output signal of the comparison unit. The division unit is coupled between the internal voltage terminal and the second ground voltage pad, and configured to divide a voltage of the internal voltage pad and generate the feedback voltage supplied to the internal voltage generation unit.

12 Claims, 9 Drawing Sheets

SEMICONDUCTOR INTEGRATED CIRCUIT

CROSS-REFERENCE TO RELATED APPLICATION

The present application claims priority of Korean Patent Application No. 10-2010-0029580, filed on Mar. 31, 2010, which is incorporated herein by reference in its entirety.

BACKGROUND OF THE INVENTION

Exemplary embodiments of the present invention relate to semiconductor design technology, and more particularly, to a semiconductor integrated circuit.

As semiconductor devices are developed to increase operation speed and reduce power consumption using ultra-fine process technology, operating voltages are also further lowered. Most semiconductor devices include an internal voltage generator configured to generate an internal voltage by using an external power supply voltage, so that internal circuits of the semiconductor devices are supplied with proper voltages. In designing such an internal voltage generator, a main issue is to constantly maintain an internal voltage at a desired level.

One representative internal voltage is a core voltage (VCORE), which is used in a core region where memory cells are provided. In the following description, a core voltage generator, which generates a core voltage (VCORE), and a write driver, which uses the core voltage as a source voltage, are considered.

Figure 1:
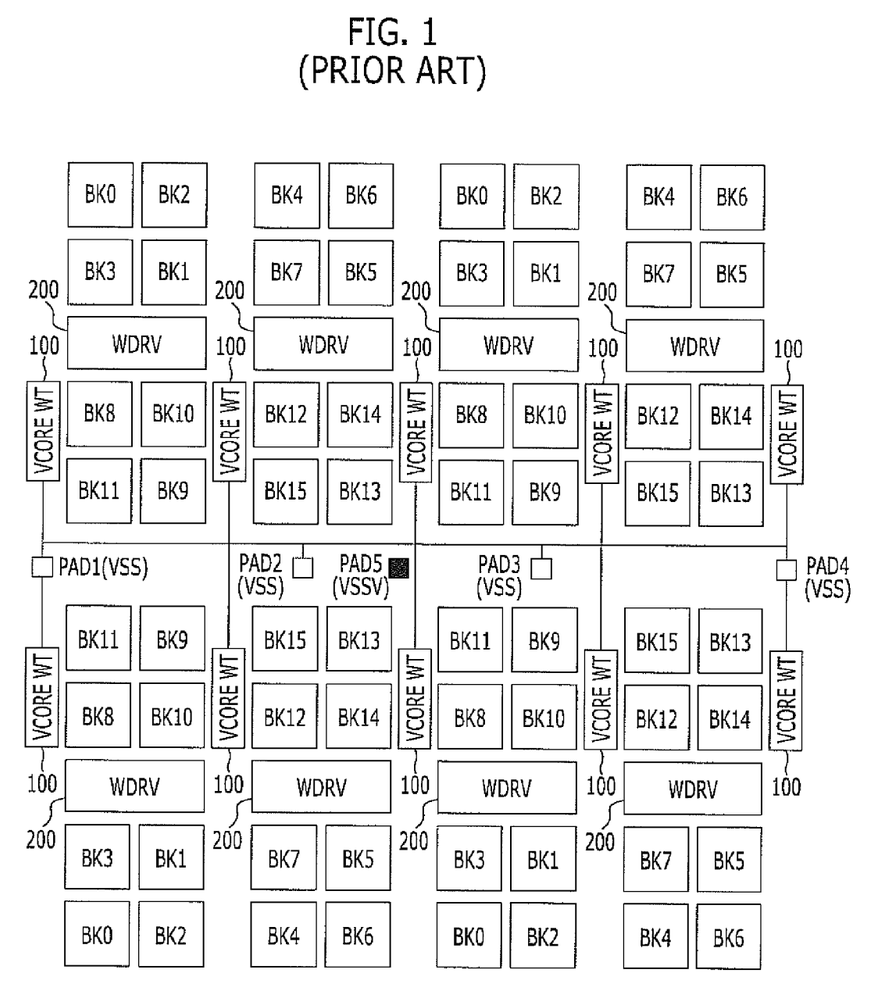
FIG. 1 is a block diagram illustrating the configuration of a conventional semiconductor integrated circuit.

FIG. 1 is a block diagram illustrating a partial configuration of a semiconductor integrated circuit.

Referring to FIG. 1, a plurality of bank groups each including banks BK0 to BK15 are provided. The concept of the bank group is introduced in order to efficiently control tens of millions of memory cells provided within the semiconductor memory device and improve operational performance. The banks BK0 to BK15 are provided with a set of memory cells. The bank groups include a plurality of write drivers 200 which write data to the memory cells.

In addition, a plurality of core voltage generators 100 are provided to supply a core voltage (VCORE) to the write drivers 200 provided in the plurality of bank groups. The core voltage generators 100 supply the core voltage (VCORE) to the banks BK0 to BK15 or the like. However, in the following description, it is assumed that the core voltage generators 100 supply the core voltage (VCORE) to only the write driver 200 in order to describe the invention without departing from the principal point of the invention.

A plurality of first ground voltage pads PAD1 to PAD4 are provided to supply a first ground voltage VSS to the core voltage generators 100, and a second ground voltage pad PAD5 is provided to supply a second ground voltage VSSV to only a specific internal circuit. The first ground voltage VSS refers to a general ground voltage supplied to the overall internal circuits of the semiconductor integrated circuit, and the second ground voltage VSSV refers to a ground voltage separated from the first ground voltage VSS and is called "Quiet VSS". Specifically, the second ground voltage VSSV is a stable ground voltage supplied only to a specific internal circuit, such as a reference voltage generator. Therefore, during the operation of the semiconductor integrated circuit, such as an active operation, a write operation, and a read operation, noise components appear in the first ground voltage VSS, but noise components do not appear in the second ground voltage VSSV. Hereinafter, the first ground voltage VSS will be referred to as a general-purpose ground voltage, and the second ground voltage VSSV will be referred to as a reference-voltage-purpose ground voltage.

Figure 2:
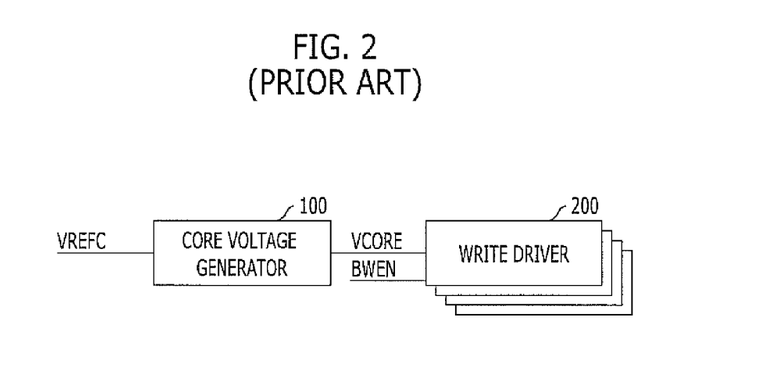
FIG. 2 is a block diagram illustrating a core voltage generator and a write driver of FIG. 1.

FIG. 2 is a block diagram illustrating the configuration of the core voltage generator 100 and the write driver 200 of FIG. 1.

Referring to FIG. 2, the core voltage generator 100 is configured to receive a reference voltage VREFC and generate and maintain a constant core voltage VCORE. The write drivers 200 are configured to use the core voltage VCORE generated by the core voltage generator 100 as a source voltage in response to a write enable signal BWEN.

Figure 3:
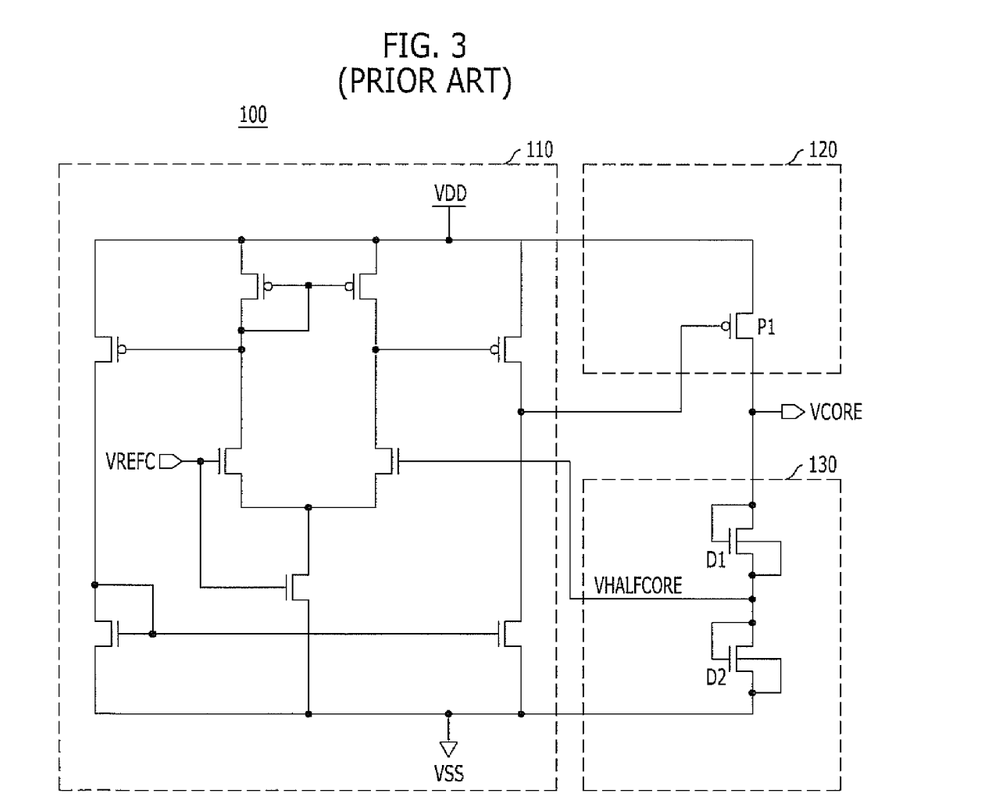
FIG. 3 is a circuit diagram illustrating the core voltage generator of FIG. 2.

FIG. 3 is a circuit diagram illustrating the core voltage generator 100 of FIG. 2.

Referring to FIG. 3, the core voltage generator 100 includes a comparison unit 110, a driving unit 120, and a division unit 130. Specifically, the comparison unit 110 is configured to compare the reference voltage VREFC with a fed-back half core voltage VHALFCORE. The driving unit 120 is configured to drive a core voltage (VCORE) terminal to a power supply voltage VDD in response to an output signal of the comparison unit 110. The division unit 130 is provided between the core voltage (VCORE) terminal and a ground voltage (VSS) pad, and configured to divide the core voltage VCORE at a preset division ratio and feed the division voltage, that is, the half core voltage VHALFCORE, back to the comparison unit 110.

The comparison unit 110 is implemented with a current mirror differential amplifier.

The driving unit 120 includes a PMOS transistor having a source coupled to a power supply voltage (VDD) terminal, a drain coupled to the core voltage (VCORE) terminal, and a gate receiving the output signal of the comparison unit 110.

The division unit 130 includes division diodes D1 and D2 coupled in series between the core voltage (VCORE) terminal and the ground voltage (VSS) pad and configured to output the half core voltage VHALFCORE. The division unit 130 may also be implemented with resistors, instead of the diodes D1 and D2. Since the division elements of the division unit 130 are configured to have the same voltage difference at both terminals thereof, the division unit 130 outputs the half core voltage VHALFCORE corresponding to the middle voltage level between the core voltage VCORE and the ground voltage VSS.

Figure 4:
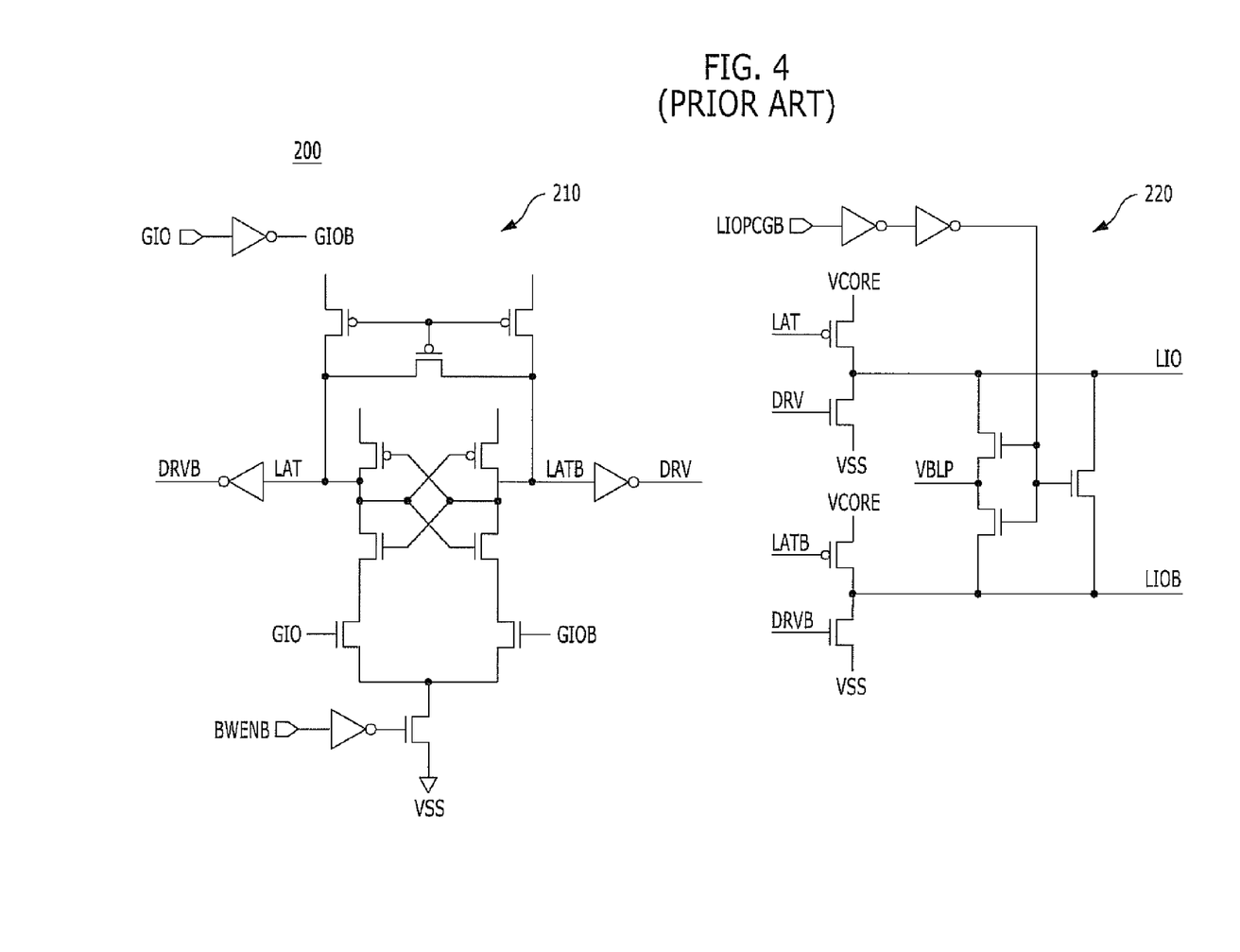
FIG. 4 is a circuit diagram illustrating the write driver of FIG. 2.

FIG. 4 is a circuit diagram illustrating the write driver 200 of FIG. 2.

Referring to FIG. 4, the write driver 200 includes a latch unit 210 and an output driving unit 220. Specifically, the latch unit 210 is configured to latch data loaded on global input/output lines GIO and GIOB. The output driving unit 220 is configured to output the data latched in the latch unit 210 to local input/output lines LIO and LIOB. When a write enable signal BWENB is activated, the latch unit 210 determines the voltage levels of driving control signals LAT and LATB and DRV and DRVB in response to the data signals loaded on the global input/output lines GIO and GIOB.

The output driving unit 220 pull-up drives the local input/output lines LIO and LIOB to the core voltage VCORE and pull-down drives the local input/output lines LIO and LIOB to the general-purpose ground voltage VSS in response to the driving control signals LAT and LATB and DRV and DRVB. Also, the output driving unit 220 precharges the local input/output lines LIO and LIOB to the half core voltage VBLP in response to a precharge signal LIOPCGB. The write enable signal BWENB and the precharge signal LIOPCGB maintain a substantially similar timing. The precharge signal LIOPCGB is deactivated when the write enable signal BWENB is activated, and the precharge signal LIOPCGB is activated when the write enable signal BWENB is deactivated.

The operation of the semiconductor integrated circuit configured as above is described below.

The core voltage generator 100 down-converts the external power supply voltage VDD and generates the constant core voltage VCORE. The write driver 200 precharges the local input/output lines LIO and LIOB to the half core voltage VBLP. In this manner, when the local input/output lines LIO and LIOB are enabled or precharged, the local input/output lines LIO and LIOB are rapidly driven to the core voltage VCORE or the general-purpose ground voltage VSS. Thus, use of the write driver 200 may be advantageous in terms of current consumption.

In a state where the write enable signal BWENB is activated, the write driver 200 pull-up or pull-down drives the local input/output lines LIO and LIOB in response to first and second data signals applied to the global input/output lines GIO and GIOB. Accordingly, the data is stored in a corresponding memory cell.

Meanwhile, due to the write operation of the write driver 200, the consumption of the core voltage VCORE increases, and thus, the voltage level of the core voltage (VCORE) terminal of the core voltage generator 100 is lowered. Therefore, the core voltage generator 100 performs the following operation in order to constantly maintain the core voltage (VCORE) terminal at the core voltage VCORE. First, the comparison unit 110 detects that the half core voltage VHALFCORE fed back from the division unit 130 is lower than the reference voltage VREFC. The driving unit 120 drives the core voltage (VCORE) terminal to the power supply voltage VDD in response to the output signal of the comparison unit 110. For example, where output of the comparison unit 110 is a logic low level signal, the driving unit 120 may drive the core voltage (VCORE) terminal to the power supply voltage VDD. In this case, the voltage level of the core voltage (VCORE) terminal rises and the half core voltage VHALFCORE outputted from the division unit 130 also rises. On the contrary, when the half core voltage VHALFCORE is equal to the reference voltage VREFC, the driving unit 120 is disabled in response to the output signal of the comparison unit 110. Through these operations, the voltage level of the core voltage (VCORE) terminal is constantly maintained.

However, the core voltage generator 100 of the conventional semiconductor integrated circuit has the following limitations.

The operating current used when the write driver 200 operates and the resistance of the general-purpose ground voltage (VSS) line itself together cause a variation in the voltage level of the general-purpose ground voltage VSS. In other words, the voltage level of the general-purpose ground voltage VSS rises as the operating current of the write driver 200 increases, or the voltage level of the general-purpose ground voltage VSS rises in proportion to the resistance which increases as the distance between the core voltage generator 100 and the general-purpose ground voltage (VSS) pads PAD1 to PAD4 becomes longer. In this case, the voltage level of the core voltage (VCORE) terminal of the core voltage generator 100 is also affected. Specifically, the division unit 130 divides the voltage applied between the core voltage (VCORE) terminal and the general-purpose ground voltage (VSS) pad at a preset division ratio, and outputs the half core voltage VCORE. At this time, when the voltage level of the general-purpose ground voltage VSS rises, the voltage level of the half core voltage VHALFCORE outputted from the division unit 130 also rises accordingly. Thus, the output signal of the comparison unit 110 is affected, which will also affect the operation of the driving unit 120. Consequently, the voltage level of the core voltage (VCORE) terminal is adjusted to a voltage level different from a normal voltage level.

Figure 5A:
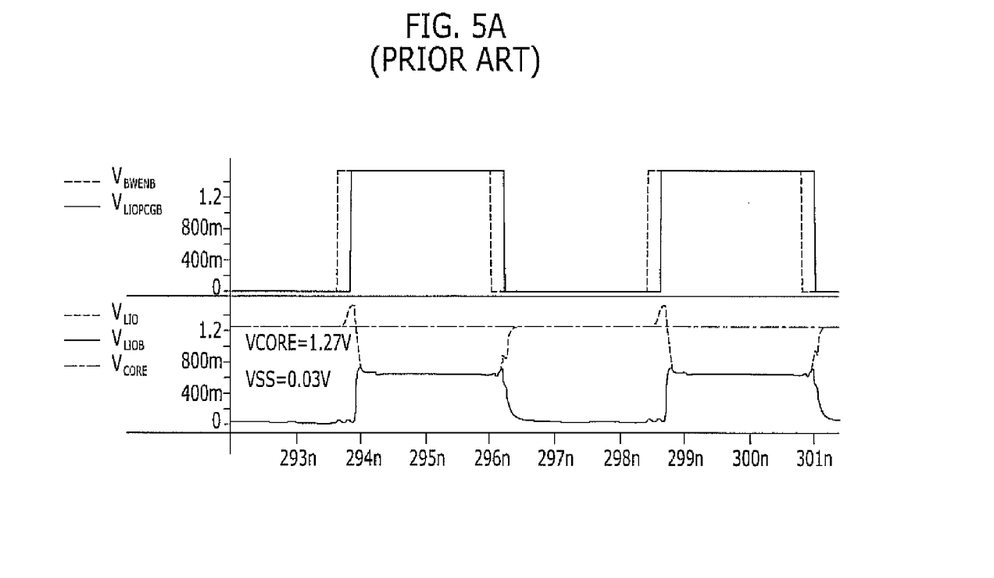
FIGS. 5A and 5B are timing diagrams illustrating characteristics of a ground voltage (VSS) and a core voltage (VCORE) which are varied when the write driver of FIG. 2 is enabled.
Figure 5B:
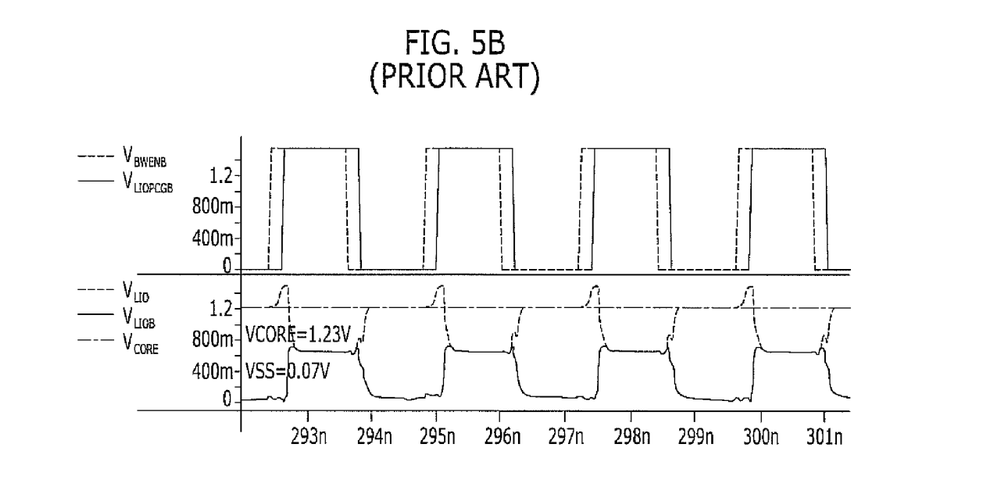

FIG. 5A is an exemplary view illustrating the voltage levels of the core voltage VCORE and the general-purpose ground voltage VSS during the write operation in a low frequency environment, and FIG. 5B is an exemplary view illustrating the voltage levels of the core voltage VCORE and the general-purpose ground voltage VSS during the write operation in a high frequency environment.

As can be seen from FIGS. 5A and 5B, the voltage level of the core voltage VCORE is lowered by as much as the increase in the voltage level of the general-purpose ground voltage VSS. That is, in the low frequency environment, the voltage level of the general-purpose ground voltage VSS rises by 0.03V and thus the voltage level of the core voltage VCORE is targeted to a lower level, for example, 1.27 V. Meanwhile, in the high frequency environment, the voltage level of the general-purpose ground voltage VSS rises by 0.07 V and thus the voltage level of the core voltage VCORE is targeted to a lower level, for example, 1.23 V. In this case, the voltage level of the general-purpose ground voltage VSS further rises in the high frequency environment than in the low frequency environment. Thus, the voltage level of the core voltage VCORE is adjusted to a lower level in the high frequency environment than in the low frequency environment. When the operating speed becomes fast like in the high frequency environment, the operating current increases so that the voltage level of the general-purpose ground voltage VSS further rises.

As the voltage level of the general-purpose ground voltage VSS rises, malfunction may occur during the write operation when the core voltage VCORE is adjusted to lower than the high voltage Vih which is a reference voltage level recognized as a "logic high" level in the semiconductor integrated circuit.

SUMMARY OF THE INVENTION

Exemplary embodiments of the present invention are directed to a semiconductor integrated circuit which is capable of substantially maintaining a voltage level of a core voltage (VCORE) terminal at a certain target level even though a voltage level of a general-purpose ground voltage is varied.

In accordance with an exemplary embodiment of the present invention, a semiconductor integrated circuit includes a first ground voltage pad configured to receive a first ground voltage, a second ground voltage pad configured to receive a second ground voltage, an internal voltage generation unit including a comparison unit configured to compare a reference voltage with a feedback voltage by using the first ground voltage, and a driving unit configured to drive an internal voltage terminal in response to an output signal of the comparison unit, and a division unit coupled between the internal voltage terminal and the second ground voltage pad, and configured to divide a voltage of the internal voltage pad and generate the feedback voltage supplied to the internal voltage generation unit.

In accordance with another exemplary embodiment of the present invention, a semiconductor integrated circuit includes a first ground voltage pad configured to receive a first ground voltage, a second ground voltage pad configured to receive a second ground voltage, a comparison unit configured to compare a reference voltage with a feedback voltage by using the first ground voltage, a driving unit configured to drive an internal voltage terminal in response to an output signal of the comparison unit, a first division unit coupled between the internal voltage terminal and the first ground voltage pad, and configured to divide a voltage of the internal voltage terminal and output a first division voltage, a second division unit coupled between the internal voltage terminal and the second ground voltage pad, and configured to divide the voltage of the internal voltage terminal and output a second division voltage, and a selective output unit configured to selectively output the first division voltage or the second division voltage as the feedback voltage in response to a control signal.

In accordance with yet another exemplary embodiment of the present invention, a semiconductor integrated circuit includes a first ground voltage pad configured to receive a first ground voltage used for a general purpose, a second ground voltage pad configured to receive a second ground voltage used in only a specific internal circuit, a comparison unit configured to compare a reference voltage with a feedback voltage by using the first ground voltage, a driving unit configured to drive an internal voltage terminal in response to an output signal of the comparison unit, and a division unit coupled between the internal voltage terminal and the second ground voltage pad, and configured to divide a voltage of the internal voltage terminal and output the feedback voltage.

In accordance with still another exemplary embodiment of the present invention a method of operating a semiconductor integrated circuit includes generating a first feedback voltage using an internal voltage and a first ground voltage, generating a second feedback voltage using the internal voltage and a second ground voltage, selecting one of the first feedback voltage and the second voltage according to a control signal, comparing the selected feedback voltage with a reference voltage, and driving the internal voltage in response to a result of the comparison.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 6:
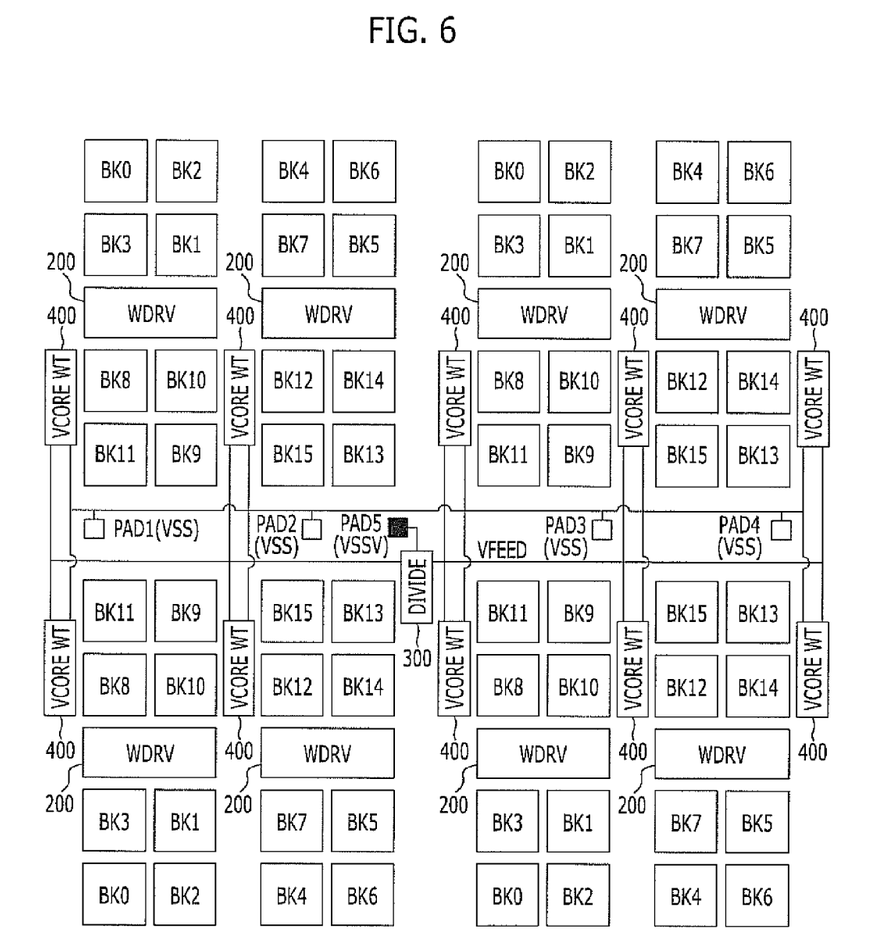
FIG. 6 is a block diagram illustrating a configuration of a semiconductor integrated circuit in accordance with an exemplary embodiment of the present invention.

FIG. 6 is a block diagram illustrating a partial configuration of a semiconductor integrated circuit in accordance with an exemplary embodiment of the present invention.

Referring to FIG. 6, a plurality of bank groups each including banks BK0 to BK15 are provided. The concept of the bank group is introduced in order to efficiently control tens of millions of memory cells provided within the semiconductor memory device and improve operational performance. The banks BK0 to BK15 are provided with a set of memory cells. The bank groups may include a plurality of write drivers 200 which write data to the memory cells. Since the write drivers 200 of FIG. 6 are substantially identical to the conventional write drivers 200 of FIG. 4, a detailed description thereof will be omitted.

A plurality of core voltage generators 400 are provided to supply a core voltage (VCORE) to the write drivers 200 provided in the plurality of bank groups. The core voltage generators 400 may supply the core voltage (VCORE) to the banks BK0 to BK15 or the like. However, in the following description, it is assumed that the core voltage generators 400 supply the core voltage (VCORE) only to the write drivers 200 in order to describe the invention without departing from the principal point of the invention.

A plurality of first ground voltage pads PAD1 to PAD4 are provided to supply a first ground voltage VSS to the core voltage generators 400, and a second ground voltage pad PAD5 is provided to supply a second ground voltage VSSV only to a specific internal circuit. The first ground voltage VSS refers to a general ground voltage supplied to the overall internal circuits of the semiconductor integrated circuit, and the second ground voltage VSSV refers to a ground voltage separated from the first ground voltage VSS and is called "Quiet VSS". Specifically, the second ground voltage VSSV is a stable ground voltage supplied only to a specific internal circuit, such as a reference voltage generator. Therefore, during the operation of the semiconductor integrated circuit, such as an active operation, a write operation, and a read operation, noise components appear in the first ground voltage VSS, but noise components do not appear in the second ground voltage VSSV. Hereinafter, the first ground voltage VSS will be referred to a general-purpose ground voltage, and the second ground voltage VSSV will be referred to as a reference-voltage-purpose ground voltage.

Figure 7:
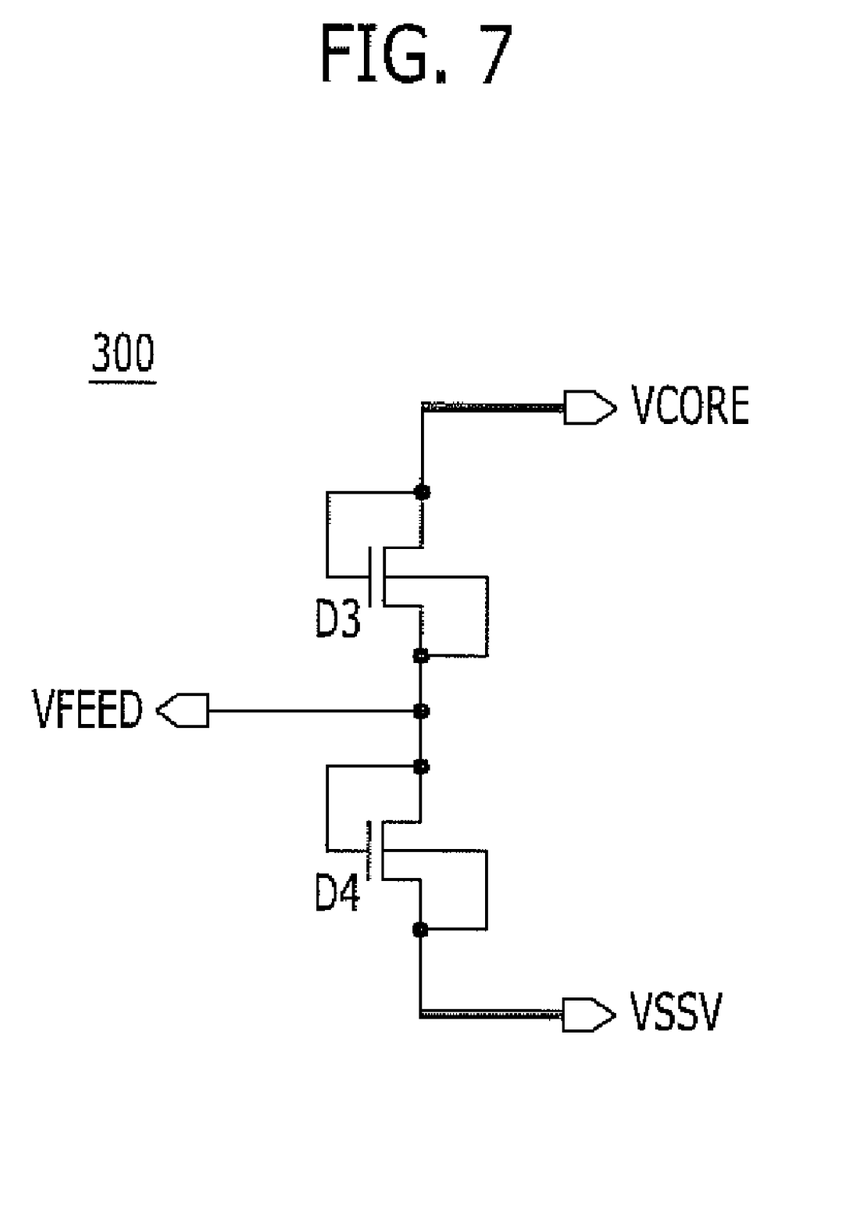
FIG. 7 is a circuit diagram illustrating an external division unit coupled to a reference-voltage-purpose ground voltage (VSSV).

An external division unit 300 is provided to receive a reference-voltage-purpose ground voltage VSSV to supply a feedback voltage VFEED to the plurality of core voltage generators 400. As illustrated in FIG. 7, the external division unit 300 is coupled between a core voltage (VCORE) terminal of the core voltage generator 400 and the reference-voltage-purpose ground voltage (VSSV) pad PAD5, and configured to divide the voltage of the core voltage (VCORE) terminal and supply the feedback voltage VFEED to the plurality of core voltage generators 400. In this case, the external division unit 300 is coupled to the core voltage (VCORE) terminal and the reference-voltage-purpose ground voltage (VSSV) pad PAD5 through voltage lines, and the external division unit 300 is coupled to the plurality of core voltage generators 400 through signal lines. As compared to the voltage line, the signal line is more advantageous in terms of an area and a resistance. Hence, the external division unit 300 is arranged so that the signal lines are longer than the voltage lines. That is, when the external division unit 300 is arranged close to the reference-voltage-purpose ground voltage (VSSV) pad PAD5, it is more advantageous in terms of an area and a resistance. Further, although it is illustrated that the external division unit 300 includes first and second diodes D3 and D4 provided between the core voltage (VCORE) terminal and the reference-voltage-purpose ground voltage (VSSV) pad, it is not limited thereto. Any division element may be used so long as it provides a resistance.

Figure 8:
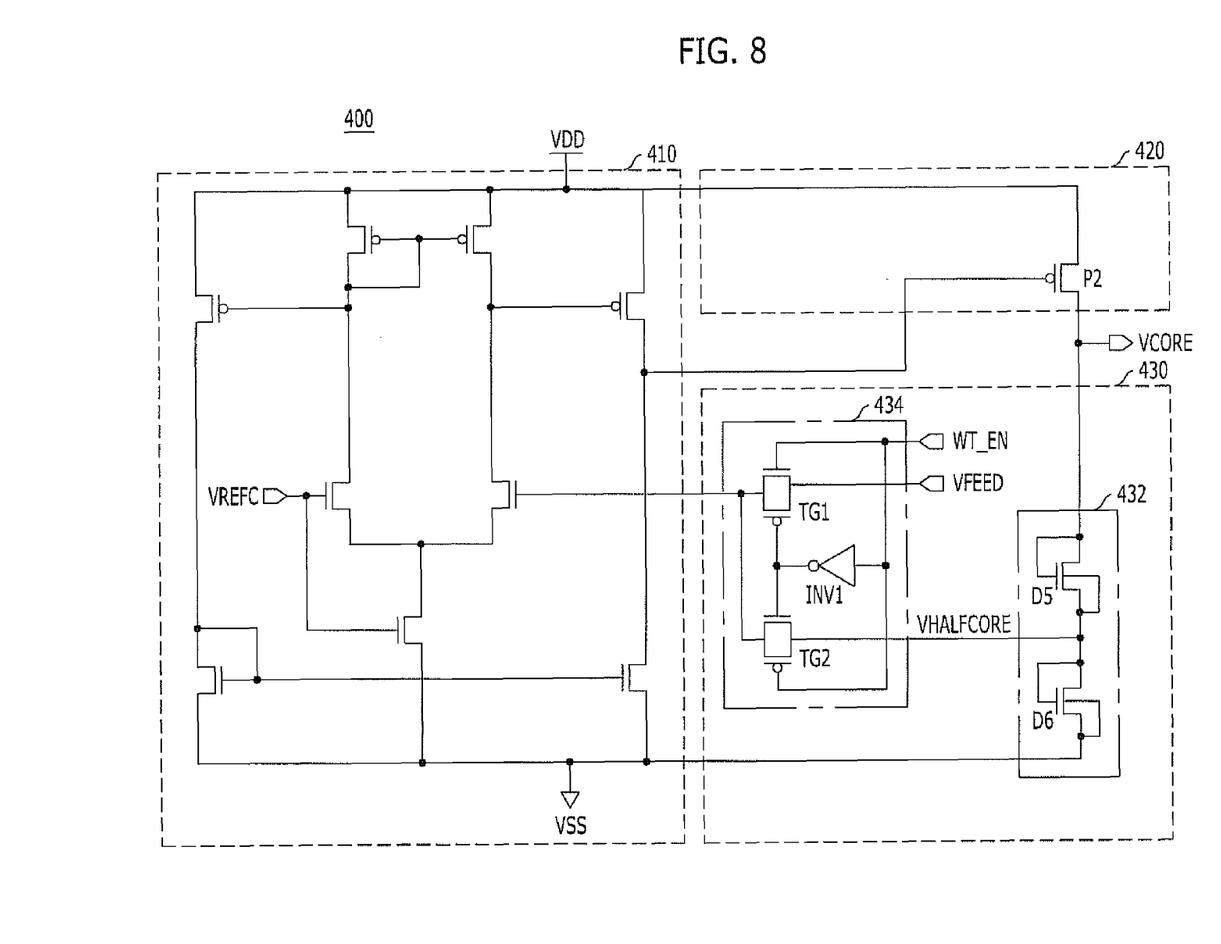
FIG. 8 is a circuit diagram illustrating an example of a core voltage generator of FIG. 6.

FIG. 8 is a circuit diagram illustrating the core voltage generator 400 of FIG. 6.

Referring to FIG. 8, the core voltage generator 400 includes a comparison unit 410, a pull-up driving unit 420, and a feedback unit 430. Specifically, the comparison unit 410 is configured to compare a reference voltage VREFC with one of a division voltage VHALFCORE and a feedback voltage VFEED. The pull-up driving unit 420 is configured to pull-up drive a core voltage (VCORE) terminal in response to an output signal of the comparison unit 410. The feedback unit 430 is coupled between the core voltage (VCORE) terminal and a ground voltage (VSS) pad. Further, the feedback unit 430 is configured to selectively output the division voltage VHALFCORE, which is generated by dividing the voltage of the core voltage (VCORE) terminal, and the feedback voltage, which is applied from the external division unit 300 in response to an operation control signal WT_EN. Since the operation control signal WT_EN is a signal derived from the write enable signal BWENB of FIG. 2, it has a timing similar to the write enable signal BWENB, and may correspond to an inversion of the write enable signal BWENB.

The comparison unit 410 may be implemented with a current mirror differential amplifier.

The pull-up driving unit 420 may include a PMOS transistor P2 having a source coupled to a power supply voltage (VDD) terminal, a drain coupled to the core voltage (VCORE) terminal, and a gate receiving an output signal of the comparison unit 410.

The feedback unit 430 includes an internal division unit 432 and a switching unit 434. The internal division unit 432 is configured to divide a voltage applied between the core voltage (VCORE) terminal and the ground voltage (VSS) pad at a first certain division ratio, and output the division voltage VHALFCORE. The switching unit 434 is configured to selectively output the division voltage VHALFCORE applied from the internal division unit 432 or the feedback voltage VFEED applied from the eternal division unit 300, in response to an operation control signal WT_EN. The internal division unit 432 of the core voltage generator 400 may include first and second diodes D5 and D6 coupled in series between the core voltage (VCORE) terminal and the ground voltage (VSS) pad. Moreover, the internal division unit 432 may be configured to output the division voltage VHALFCORE as a half core voltage. The internal division unit 432 of the core voltage generator 400 may be implemented with division elements such as resistors, instead of the diodes D5 and D6. These division elements may be configured to have the same division ratio as that of the external division unit 300.

The switching unit 434 includes a first transmission gate TG1 and a second transmission gate TG2. The first transmission gate TG1 is configured to output the feedback voltage VFEED to the comparison unit 410 in response to the operation control signal WT_EN, and the second transmission gate TG2 is configured to output the division voltage VHALFCORE to the comparison unit 410 in response to the operation control signal WT_EN. In the switching unit 434, the operation control signal WT_EN is applied to an inverting control terminal of the first transmission gate TG1 and a non-inverting control terminal of the second transmission gate TG2 through an inverter INV1, and the operation control signal WT_EN is also applied to a non-inverting control terminal of the first transmission gate TG1 and an inverting control terminal of the second transmission gate TG2.

The operation of the semiconductor integrated circuit configured as above in accordance with an exemplary embodiment of the present invention is described below.

Specifically, a normal mode and an operation mode are described, and the case in which the operation mode is a write operation mode is exemplified.

First, the normal mode is described.

In the normal mode, the deactivated operation control signal WT_EN is applied to the feedback unit 430.

According to the deactivated operation control signal WT_EN, the feedback unit 430 applies the half core voltage VHALFCORE to the comparison unit 410. The half core voltage VHALFCORE corresponds to half of the voltage applied between the core voltage (VCORE) terminal and the general-purpose ground voltage (VSS) pad. More specifically, the second transmission gate TG2 of the switching unit 434 is turned on in response to the deactivated operation control signal WT_EN, and the first transmission gate TG1 of the switching unit 434 is turned off in response to the deactivated operation control signal WT_EN, so that the division voltage VHALFCORE outputted from the internal division unit 432 is applied to the comparison unit 410.

The comparison unit 410 continuously compares the division voltage VHALFCORE applied from the feedback unit 430 with the reference voltage VREFC. As a result of the comparison unit 410, when the division voltage VHALFCORE is lower than the reference voltage VREFC, the pull-up driving unit 420 is enabled to drive the core voltage (VCORE) terminal to the power supply voltage VDD.

In this case, the voltage level of the core voltage (VCORE) terminal rises, and thus, the voltage level of the division voltage VHALFCORE applied from the feedback unit 430 also rises. Subsequently, when the voltage level of the division voltage VHALFCORE reaches the voltage level of the reference voltage VREFC, the comparison unit 410 detects this equilibrium point and disables the pull-up driving unit 420. Hence, the core voltage (VCORE) terminal is substantially maintained at a certain voltage level.

Next, the write operation mode is described below with reference to FIG. 4, which illustrates a conventional writer driver 200 that is substantially identical to the write drivers 200 of FIG. 6.

When the write enable signal BWENB is activated, the latch unit 210 determines the voltage levels of the driving control signals LAT and LATB and DRV and DRVB in response to the data signals loaded on the global input/output lines GIO and GIOB. The output driving unit 220 pull-up drives the local input/output lines LIO and LIOB to the core voltage VCORE and pull-down drives the local input/output lines LIO and LIOB to the general-purpose ground voltage VSS in response to the driving control signals LAT and LATB and DRV and DRVB.

As the write driver 200 is enabled, the core voltage VCORE generated by the core voltage generator 400 may be supplied to the local input/output lines LIO and LIOB, so that the voltage level of the core voltage (VCORE) terminal drops. Therefore, the core voltage generator 400 performs the following operations in order to substantially maintain the core voltage (VCORE) terminal at a certain voltage level.

First, the activated operation control signal WT_EN is applied to the feedback unit 430.

In this case, the feedback unit 430 applies the feedback voltage VFEED, which is half of the core voltage, to the comparison unit 410. The half core voltage corresponds to half of the voltage difference between the core voltage (VCORE) terminal and the reference-voltage-purpose ground voltage (VSSV) pad. More specifically, the first transmission gate TG1 of the switching unit 434 is turned on and the second transmission gate TG2 of the switching unit 434 is turned off in response to the activated operation control signal WT_EN, so that the feedback voltage VFEED outputted from the external division unit 300 is applied to the comparison unit 410. As described above, when the write driver 200 is enabled, a relatively large amount of an operating current is consumed in the write driver 200. Thus, the general-purpose ground voltage VSS used by the write driver 200 rises by a certain voltage level (current used×resistance of the voltage line). Further, the voltage level of the general-purpose ground voltage VSS rises more in the high frequency environment in which a large amount of the operating current is consumed (see FIGS. 5A and 5B). Accordingly, when the write driver 200 is enabled, the feedback voltage VFEED of the external division unit 300, using the stable reference-voltage-purpose ground voltage VSSV, is applied to the comparison unit 410.

The comparison unit 410 continuously compares the feedback voltage VFEED applied from the feedback unit 430 with the reference voltage VREFC. As a result of the comparison unit 410, when the feedback voltage VFEED is lower than the reference voltage VREFC, the pull-up driving unit 420 is enabled to drive the core voltage (VCORE) terminal to the power supply voltage VDD.

In this case, the voltage level of the core voltage (VCORE) terminal rises, and thus, the voltage level of the feedback voltage VFEED outputted from the feedback unit 430 also rises. Subsequently, when the voltage level of the feedback voltage VFEED reaches the voltage level of the reference voltage VREFC, the comparison unit 410 detects this equilibrium point and disables the pull-up driving unit 420.

Figure 9:
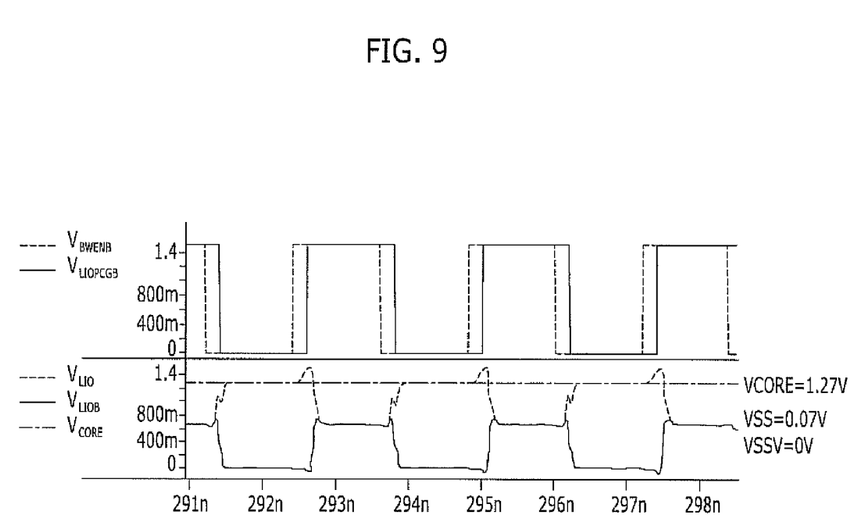
FIG. 9 is a timing diagrams illustrating a target level of the core voltage generator of FIG. 6.

Through these operations, the voltage level of the core voltage (VCORE) terminal is constantly maintained. As illustrated in FIG. 9, the voltage level of the general-purpose ground voltage VSS actually rises to 0.07 V as the write driver 200 is enabled, but the voltage level of the reference-voltage-purpose ground voltage VSSV is constantly maintained at 0 V, even though the write driver 200 is enabled. Therefore, when the write driver 200 is enabled, the feedback voltage VSSV of the external division unit 300 using the reference-voltage-purpose ground voltage VSSV is applied, so that the voltage level of the core voltage (VCORE) terminal is constantly targeted to 1.27 V.

In accordance with the exemplary embodiments of the present invention, since the core voltage (VCORE) terminal is adjusted to a certain voltage level even in the write operation mode, the write operation is always normally performed. Furthermore, since the division voltage VHALFCORE of the internal division unit 432 and the feedback voltage VFEED of the external division unit 300 are selectively used depending on the mode, the response speed, is not reduced in the normal mode where the division voltage VHALFCORE of the internal division unit 432 having the fast response speed is used.

Figure 10:
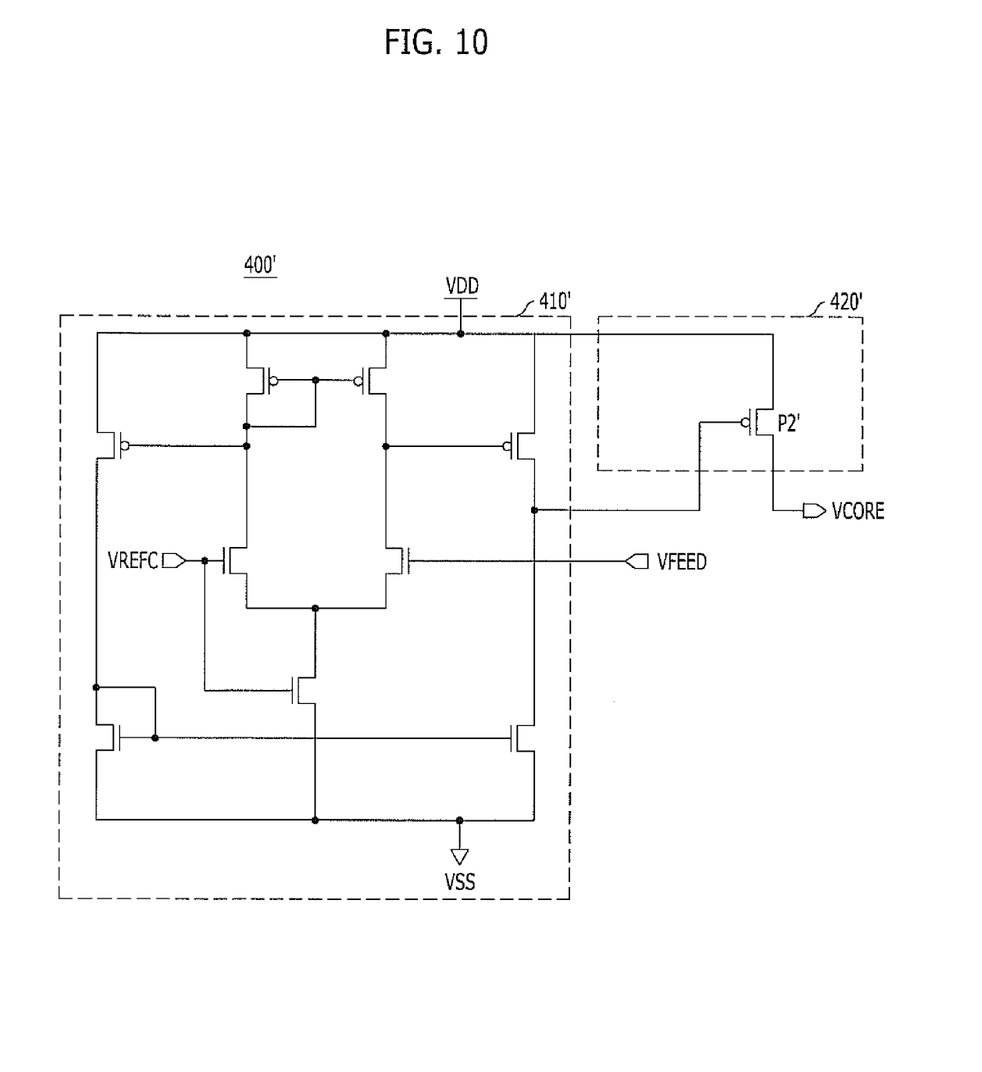
FIG. 10 is a circuit diagram illustrating another example of a core voltage generator of FIG. 6.

Meanwhile, although the core voltage generator may be implemented with the configuration of FIG. 8, it may also be implemented with the configuration of FIG. 10. That is, a core voltage generator 400' is configured to detect the feedback voltage VFEED of the external division unit 300 and maintain the core voltage (VCORE) terminal at the preset target level, regardless of the normal mode and the write operation mode. Since a comparison unit 410' and a driving unit 420' included in the core voltage generator 400' are substantially identical to the comparison unit 410 and the driving unit 420 illustrated in FIG. 8, a detailed description thereof will be omitted.

In accordance with another exemplary embodiment of the present invention, the internal division unit provided in each core voltage generator may be removed, and only one external division unit may be provided, thereby minimizing the circuit area of the semiconductor integrated circuit.

Furthermore, it is possible to substantially prevent the case in which the voltage level of the core voltage (VCORE) terminal is incorrectly adjusted due to the increase in the voltage level of the general-purpose ground voltage VSS during the write operation. In particular, the effect is prominently exhibited in the high frequency environment. Thus, the operational reliability and stability of the semiconductor integrated circuit in accordance with the exemplary embodiments of the present invention are enhanced.

While the present invention has been described with respect to the specific embodiments, it will be apparent to those skilled in the art that various changes and modifications may be made without departing from the spirit and scope of the invention as defined in the following claims.

Although it has been described above that the internal voltage generator generates the voltage to be supplied to the write driver, it is not limited thereto. For example, the internal voltage generators in accordance with exemplary embodiments of the present invention may also be applied to a variety of peripheral circuits, such as a delay locked loop (DLL) and a phase locked loop (PLL), which may consume a large amount of an operating current.

Moreover, instead of providing the external division unit in the semiconductor integrated circuit, the semiconductor integrated circuit may be designed so that the core voltage generator including the comparison unit, the driving unit, and the internal division unit is selectively coupled to the general-purpose ground voltage (VSS) pad and the reference-voltage-purpose ground voltage (VSSV) pad, depending on the mode.

What is claimed is:
1. A semiconductor integrated circuit, comprising:
a first ground voltage pad configured to receive a first ground voltage;
a second ground voltage pad configured to receive a second ground voltage which is more stable than the first ground voltage;
an internal voltage generation unit comprising:
a comparison unit configured to compare a reference voltage with a feedback voltage by using the first ground voltage; and
a driving unit configured to drive an internal voltage terminal in response to an output signal of the comparison unit; and
a division unit coupled between the internal voltage terminal and the second ground voltage pad, and configured to divide a voltage of the internal voltage terminal and generate the feedback voltage supplied to the internal voltage generation unit.

2. The semiconductor integrated circuit of claim 1, wherein the division unit and the second ground voltage pad are coupled together through a voltage line, and the division unit and the internal voltage generation unit are coupled together through a signal line.

3. The semiconductor integrated circuit of claim 2, wherein the division unit is arranged closer to the second ground voltage pad than the internal voltage generation unit.

4. A semiconductor integrated circuit, comprising:
a first ground voltage pad configured to receive a first ground voltage;
a second ground voltage pad configured to receive a second ground voltage;
a comparison unit configured to compare a reference voltage with a feedback voltage by using the first ground voltage;
a driving unit configured to drive an internal voltage terminal in response to an output signal of the comparison unit;
a first division unit coupled between the internal voltage terminal and the first ground voltage pad, and configured to divide a voltage of the internal voltage terminal and output a first division voltage;
a second division unit coupled between the internal voltage terminal and the second ground voltage pad, and configured to divide the voltage of the internal voltage terminal and output a second division voltage; and
a selective output unit configured to selectively output the first division voltage or the second division voltage as the feedback voltage in response to a control signal.

5. The semiconductor integrated circuit of claim 4, wherein the first division unit and the second division unit are configured to divide the voltage of the internal voltage terminal according to an identical division ratio.

6. The semiconductor integrated circuit of claim 4, wherein the second division unit and the second ground voltage pad are coupled together through a voltage line, and the second division unit and the selective output unit are coupled together through a signal line.

7. The semiconductor integrated circuit of claim 6, wherein the voltage line is shorter than the signal line.

8. The semiconductor integrated circuit of claim 4, wherein the control signal comprises a write enable signal.

9. A semiconductor integrated circuit, comprising:
a first ground voltage pad configured to receive a first ground voltage;
a second ground voltage pad configured to receive a second ground voltage which is more stable than the first ground voltage;
a comparison unit configured to compare a reference voltage with a feedback voltage by using the first ground voltage;
a driving unit configured to drive an internal voltage terminal in response to an output signal of the comparison unit; and
a division unit coupled between the internal voltage terminal and the second ground voltage pad, and configured to divide a voltage of the internal voltage terminal and output the feedback voltage.

10. The semiconductor integrated circuit of claim 9, wherein the division unit and the second ground voltage pad are coupled together through a voltage line, and the division unit and the comparison unit are coupled together through a signal line.

11. The semiconductor integrated circuit of claim 10, wherein the voltage line is shorter than the signal line.

12. A method of operating a semiconductor integrated circuit, the method comprising:
generating a first feedback voltage using an internal voltage and a first ground voltage which is received by a first ground voltage pad;
generating a second feedback voltage using the internal voltage and a second ground voltage which is received by a second voltage ground pad and more stable than the first around voltage;
selecting one of the first feedback voltage and the second feedback voltage according to a control signal;
comparing the selected feedback voltage with a reference voltage; and
driving the internal voltage in response to a result of the comparison.

* * * * *